(12) United States Patent
Woo et al.

(10) Patent No.: US 12,512,421 B2
(45) Date of Patent: Dec. 30, 2025

(54) SEMICONDUCTOR DEVICE INCLUDING GUARD RING

(71) Applicant: SK hynix Inc., Icheon (KR)

(72) Inventors: Bin Woo, Icheon (KR); Seung In Shin, Icheon (KR)

(73) Assignee: SK hynix Inc., Icheon (KR)

( * ) Notice: Subject to any disclaimer, the term of this patent is extended or adjusted under 35 U.S.C. 154(b) by 384 days.

(21) Appl. No.: 18/298,956

(22) Filed: Apr. 11, 2023

(65) Prior Publication Data

US 2024/0162170 A1 May 16, 2024

(30) Foreign Application Priority Data

Nov. 15, 2022 (KR) .................. 10-2022-0152393

(51) Int. Cl.
*H01L 23/58* (2006.01)
*H01L 23/00* (2006.01)

(52) U.S. Cl.
CPC .......... *H01L 23/585* (2013.01); *H01L 23/562* (2013.01)

(58) Field of Classification Search
None
See application file for complete search history.

(56) References Cited

U.S. PATENT DOCUMENTS

| 10,714,384 | B2 | 7/2020 | Yang et al. | |
| 2023/0238335 | A1* | 7/2023 | Seo ......................... | H01L 23/585 |
| 2023/0387040 | A1* | 11/2023 | Chang ..................... | H01L 22/34 |
| 2024/0145399 | A1* | 5/2024 | Chang ..................... | H01L 23/562 |

FOREIGN PATENT DOCUMENTS

KR 101581431 B1 12/2015

* cited by examiner

*Primary Examiner* — Bo B Jang (57) ABSTRACT

A semiconductor device includes: a semiconductor substrate; and a guard ring including a plurality of conductive patterns stacked over the semiconductor substrate in a first direction to be spaced apart from each other, and a conductive plug disposed between two adjacent conductive patterns among the plurality of conductive patterns, the first direction being perpendicular to a top surface of the semiconductor substrate, wherein the conductive plug includes a plurality of long patterns and a plurality of short patterns.

20 Claims, 6 Drawing Sheets

SEMICONDUCTOR DEVICE INCLUDING GUARD RING

CROSS-REFERENCE TO RELATED APPLICATION

This application claims priority under 35 U.S.C. § 119 to Korean Patent Application No. 10-2022-0152393 filed on Nov. 15, 2022, which is incorporated herein by reference in its entirety.

BACKGROUND

1. Technical Field

This patent document relates to a semiconductor technology, and particularly, to a semiconductor device including a guard ring.

2. Related Art

An integrated circuit performing a predetermined function may be formed over a semiconductor substrate. The integrated circuit may be formed in each of a plurality of chip regions, and a scribe lane area may exist between the plurality of chip regions to distinguish the plurality of chip regions from each other.

After forming the integrated circuit, a sawing process of cutting the semiconductor substrate in the scribe lane region may be performed to physically separate a plurality of semiconductor chips from each other.

Meanwhile, stress generated during the sawing process may be transferred into material layers constituting the integrated circuit in the chip region and thus cause various defects such as cracks. To prevent the defects, a guard ring surrounding the chip region may be formed.

SUMMARY

In an embodiment, a semiconductor device may include: a semiconductor substrate; and a guard ring including a plurality of conductive patterns stacked over the semiconductor substrate in a first direction to be spaced apart from each other, and a conductive plug disposed between two adjacent conductive patterns among the plurality of conductive patterns, the first direction being perpendicular to a top surface of the semiconductor substrate, wherein the conductive plug includes a plurality of long patterns and a plurality of short patterns, the plurality of long patterns extending in a second direction to be parallel to each other and spaced apart from each other in a third direction, the plurality of short patterns extending in the third direction, disposed between two adjacent long patterns among the plurality of long patterns to connect the two adjacent long patterns, and spaced apart from each other in the second direction, the second direction crossing the third direction, the second and third directions being parallel to the top surface of the semiconductor substrate, and wherein an internal insulating layer, which has a side surface that is surrounded by the two adjacent long patterns and two adjacent short patterns among the plurality of short patterns, is connected to at least one of an external insulating layer and another internal insulating layer through an open portion disposed in at least one of the two adjacent long patterns, the external insulating layer positioned outside the conductive plug.

In another embodiment, a semiconductor device may include: a semiconductor substrate; and a guard ring including a plurality of conductive patterns stacked over the semiconductor substrate in a first direction to be spaced apart from each other, and a conductive plug disposed between two adjacent conductive patterns among the plurality of conductive patterns, the first direction being perpendicular to a top surface of the semiconductor substrate, wherein the conductive plug includes a plurality of long patterns and a plurality of short patterns, the plurality of long patterns extending in a second direction to be parallel to each other and spaced apart from each other in a third direction, the plurality of short patterns extending in the third direction, disposed between two adjacent long patterns among the plurality of long patterns to connect the two adjacent long patterns, and spaced apart from each other in the second direction, the second direction crossing the third direction, the second and third directions being parallel to the top surface of the semiconductor substrate, and wherein at least one of the plurality of long patterns has a shape cut between two adjacent short patterns among the plurality of short patterns

DETAILED DESCRIPTION

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1:
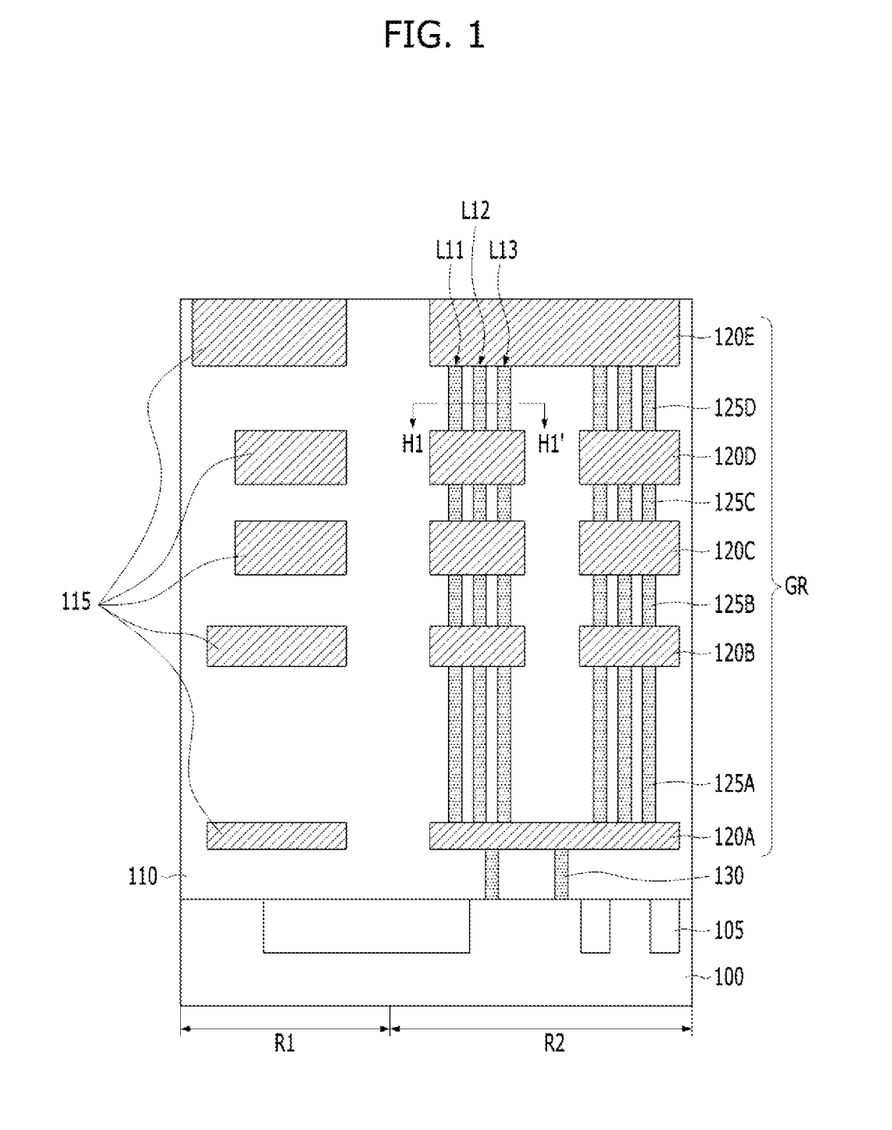
FIG. 1 is a cross-sectional view illustrating a semiconductor device according to an embodiment of the present disclosure.
Figure 2:
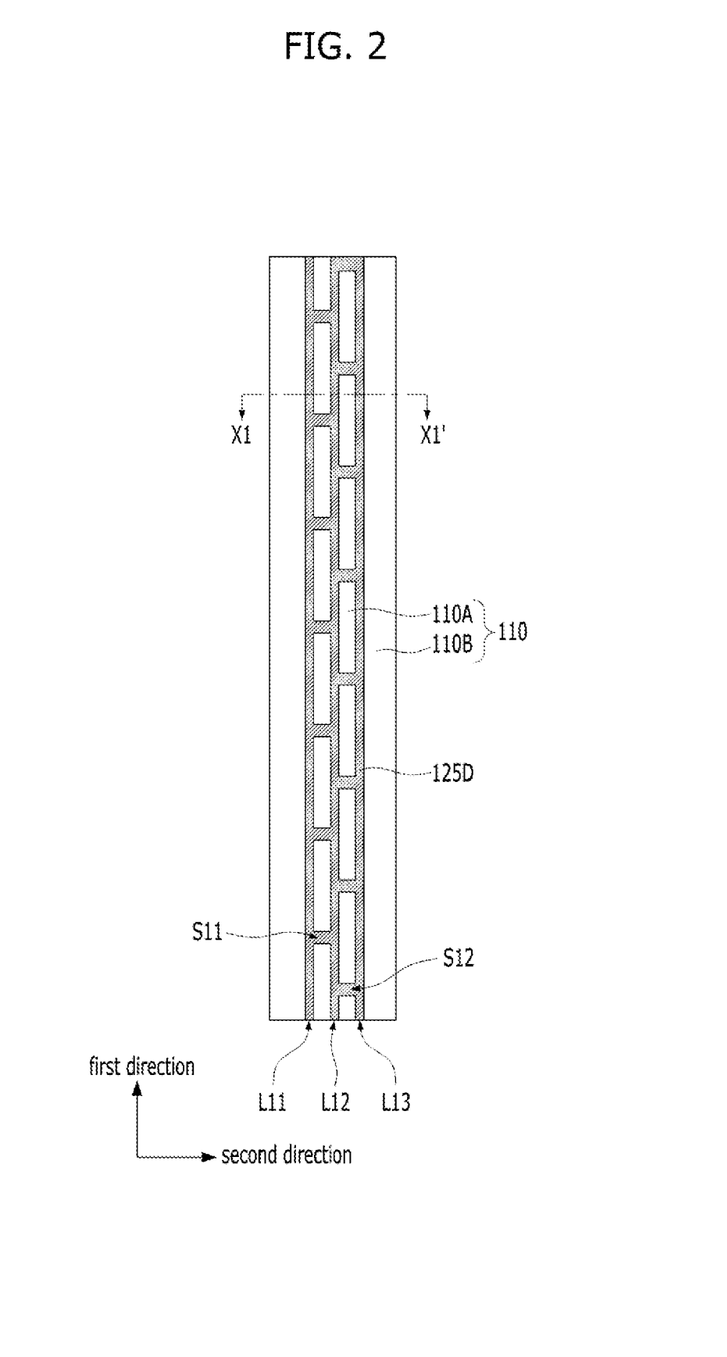
FIG. 2 is a plan view taken along a line H1-H1' of FIG. 1.

FIG. 1 is a cross-sectional view illustrating a semiconductor device according to an embodiment of the present disclosure, and FIG. 2 is a plan view taken along a line H1-H1' of FIG. 1. A cross section taken along a line X1-X1' of FIG. 2 may correspond to a portion indicated by the line H1-H1' of FIG. 1.

Referring to FIG. 1, the semiconductor device may include a semiconductor substrate 100, and an integrated circuit 115 and a guard ring GR that are disposed over the semiconductor substrate 100.

The semiconductor substrate 100 may include a first region R1 and a second region R2 adjacent to the first region R1. The integrated circuit 115 is disposed in the first region R1, and the guard ring GR is disposed in the second region R2. The first region R1 may correspond to a chip region, and the second region R2 may correspond to a scribe lane region surrounding the chip region.

In another embodiment, the second region R2 may correspond to a region located between the chip region and the scribe lane region. Although not shown in this figure, when the first region R1 has a plate shape and the second region R2 surrounds the first region R1, the guard ring GR may have a loop shape surrounding the first region R1 when viewed in a plan view.

The semiconductor substrate 100 may include a semiconductor material such as silicon, germanium, or a combination thereof. An isolation layer 105 may be formed in the semiconductor substrate 100 to define an active region of the semiconductor substrate 100.

The integrated circuit 115 may be implemented to perform certain functions such as data storage and data processing by a combination of various discrete elements and electrical connections between the various discrete elements. The discrete elements may include an active element such as a transistor, a passive element such as a resistor, a capacitor, or the like. For convenience of description, components constituting the integrated circuit 115 are briefly illustrated as five elements in FIG. 1. However, embodiments are not limited to the five elements, and the integrated circuit 115 may be implemented in various ways by variously connecting conductors of various shapes.

The guard ring GR may include a combination of a plurality of conductive patterns 120A to 120E and a plurality of conductive plugs 125A to 125D that are alternately stacked over the semiconductor substrate 100. That is, the conductive patterns 120A to 120E may be stacked in a vertical direction with respect to an upper surface of the semiconductor substrate 100. The conductive plugs 125A to 125D may be disposed between the conductive patterns 120A to 120E to connect them. Each of the conductive patterns 120A to 120E and the conductive plugs 125A to 125D may include any of various conductive materials. For example, the conductive material may include a metal such as platinum (Pt), tungsten (W), aluminum (Al), copper (Cu), tantalum (Ta), titanium (Ti), nickel (Ni), or molybdenum (Mo), a metal nitride such as titanium nitride (TiN) or tantalum nitride (TaN), or a combination thereof.

In the present embodiment, a first conductive pattern 120A, a second conductive pattern 120B, a third conductive pattern 120C, a fourth conductive pattern 120D, and a fifth conductive pattern 120E may be sequentially stacked over the semiconductor substrate 100. In addition, a first conductive plug 125A, a second conductive plug 125B, a third conductive plug 125C, and a fourth conductive plug 125D may be disposed between the first conductive pattern 120A and the second conductive pattern 120B, between the second conductive pattern 120B and the third conductive pattern 120C, between the third conductive pattern 120C and the fourth conductive pattern 120D, and between the fourth conductive pattern 120D and the fifth conductive pattern 120E, respectively. However, embodiments are not limited thereto, and the number of stacked conductive patterns and the number of conductive plugs may be variously modified.

In the present embodiment, one first conductive pattern 120A and one fifth conductive pattern 120E may be disposed. Two second conductive patterns 120B, two third conductive patterns 120C, and two fourth conductive patterns 120D may be disposed. However, embodiments are not limited thereto, and the number of each of the first to fifth conductive patterns 120A to 120E may be variously modified.

When there are the one first conductive pattern 120A and the one fifth conductive pattern 120E, the first conductive pattern 120A and the fifth conductive pattern 120E may overlap the second to fourth conductive patterns 120B, 120C, and 120D when viewed in a plan view, while having a larger width than the second to fourth conductive patterns 120B, 120C, and 120D. The second to fourth conductive patterns 120B, 120C, and 120D may have substantially the same width while overlapping each other.

When the guard ring GR has a loop shape surrounding the first region R1, each of the first to fifth conductive patterns 120A, 120B, 120C, 120D, and 120E may have a loop shape. In addition, a loop formed by one of the two second conductive patterns 120B, which is relatively far from the first region R1, may surround a loop formed by the other of the two second conductive patterns 120B, which is closer to the first region R1 than the one of the two second conductive patterns 120B. Similarly, a loop formed by one of the two third conductive patterns 120C, which is relatively far from the first region R1, may surround a loop formed by the other of the two third conductive patterns 120C, which is closer to the first region R1 than the one of the two third conductive patterns 120C. Similarly, a loop formed by one of the two fourth conductive patterns 120D, which is relatively far from the first region R1, may surround a loop formed by the other of the two fourth conductive patterns 120D, which is closer to the first region R1 than the one of the two fourth conductive patterns 120D.

The guard ring GR may be electrically connected to the semiconductor substrate 100 through a conductive plug 130 positioned between the first conductive pattern 120A and the semiconductor substrate 100.

The integrated circuit 115, the guard ring GR, and the conductive plug 130 may be buried in an insulating layer 110 disposed over the semiconductor substrate 100. Although not shown, the insulating layer 110 may have a structure in which two or more interlayer insulating layers are stacked. The insulating layer 110 may include any of various insulating materials such as a silicon oxide, a silicon nitride, an insulating material having a low dielectric constant, or a combination thereof.

Meanwhile, a shape of each of the first to fourth conductive plugs 125A to 125D for forming the guard ring GR will be further described with reference to FIG. 2. For convenience of description, the fourth conductive plug 125D will be shown and described, but each of the first to third conductive plugs 125A to 125C may overlap the fourth conductive plug 125D, and thus, may have substantially the same shape as the fourth conductive plug 125D.

Referring to FIGS. 1 and 2, the fourth conductive plug 125D may include first to third long patterns L11 to L13 having a relatively long length, and first and second short patterns S11 and S12 having a relatively short length. The first to third long patterns L11 to L13 may be longer than the first and second short patterns S11 and S12.

The first to third long patterns L11 to L13 may be spaced apart from each other and substantially parallel to each other. In FIG. 2, the first to third long patterns L11 to L13 are illustrated as extending in a first direction, for example, in a longitudinal direction. However, embodiments are not limited thereto. When the guard ring GR has a loop shape surrounding the first region R1 in a plan view, each of the first to third long patterns L11 to L13 may also have a loop shape. However, even in the case of having the loop shape, it may be assumed that the first to third long patterns L11 to L13 are parallel to each other in a loop direction.

The first short pattern S11 and the second short pattern S12 may extend in a second direction crossing the first direction in which the first to third long patterns L11 to L13 extend. The first short pattern S11 may be disposed between the first long pattern L11 and the second long pattern L12 to connect the first long pattern L11 and the second long pattern L12, and the second short pattern S12 may be disposed between the second long pattern L12 and the third long pattern L13 to connect the second long pattern L12 and the third long pattern L13. A plurality of first short patterns S11 may be arranged to be spaced apart from each other in the first direction between the first long pattern L11 and the second long pattern L12, and a plurality of second short patterns S12 may be arranged to be spaced apart from each other in the first direction between the second long pattern L12 and the third long pattern L13. In FIG. 2, the first and second short patterns S11 and S12 are illustrated as extending in the second direction substantially perpendicular to the first direction. However, embodiments are not limited thereto. When each of the first to third long patterns L11 to L13 has a loop shape in a plan view, some of the first and second short patterns S11 and S12 may extend in different directions along a curve of the first to third long patterns L11 to L13. Accordingly, some of the first and second short patterns S11 and S12 may not be parallel to the other first and second short patterns S11 and S12.

By the above arrangement shown in FIG. 2, the first long pattern L11, the second long pattern L12, and the plurality of first short patterns S11 therebetween may form a ladder shape or a shape similar thereto. Also, the second long pattern L12, the third long pattern L13, and the plurality of second short patterns S12 therebetween may form a ladder shape or a shape similar thereto.

Furthermore, the plurality of first short patterns S11 and the plurality of second short patterns S12 may be arranged to be misaligned. In other words, in the first direction, one second short pattern S12 may be positioned between two adjacent short patterns S11, and one first short pattern S11 may be positioned between two adjacent short patterns S12. For example, one second short pattern S12 may be located to have substantially the same distance from two adjacent first short patterns S11, and one first short pattern S11 may be located to have substantially the same distance from two adjacent second short patterns S12. Thus, as shown in FIG. 2, the fourth conductive plug 125D has a shape in which two ladders are arranged side by side in the second direction while the plurality of first short patterns S11 and the plurality of second short patterns S12 are alternately located in the first direction.

According to the embodiment described above, since at least one of the first to fourth conductive plugs 125A to 125D has at least three long patterns L11, L12, and L13, durability during a sawing process may be improved. In addition, since the short patterns S11 and S12 connect the long patterns L11, L12, and L13 to each other so that a combination of the long patterns L11, L12, and L13 and the short patterns S11 and S12 has a shape in which two ladders are arranged side by side in the second direction, it may be possible to effectively block or reduce moisture penetrating from the outside, for example, from above the semiconductor device of FIG. 1. Furthermore, since the first short patterns S11 and the second short patterns S12 are alternately aligned in the first direction, the moisture blocking or reduction effect may be further improved.

Meanwhile, in the embodiment shown in FIG. 2, some portions of the insulating layer 110 may be surrounded by the long patterns L11, L12, and L13 and the short patterns S11 and S12. Each of the portions of the insulating layer 110 will be referred to as an internal insulating layer 110A. Except for the internal insulating layers 110A, the other portions of the insulating layer 110 that exist outside the first and third long patterns L11 and L13 will be referred to as an external insulating layer 110B.

The internal insulating layer 110A may be isolated by being surrounded by the long patterns L11, L12, and L13 and the short patterns S11 and S12, and may be pulled out or collapsed as the aspect ratio thereof increases. If the internal insulating layer 110A is pulled out or collapsed, the guard ring GR may not be normally maintained, and thus, defects may occur.

When the integrated circuit 115 includes a semiconductor memory having a relatively small height, for example, DRAM (Dynamic Random Access Memory), the aspect ratio of the internal insulating layer 110A may be relatively small. On the other hand, when the integrated circuit 115 includes a semiconductor memory having a relatively great height, for example, PCRAM (Phase Change Random Access Memory) having a structure in which a plurality of cells are stacked in a vertical direction, the aspect ratio of the internal insulating layer 110A may be relatively large. Accordingly, the defect of the guard ring GR may be more severe in the PCRAM than in the DRAM. In the following embodiments, a method capable of preventing or reducing the occurrence of defects even though the aspect ratio of the internal insulating layer 110A is increased will be proposed.

Figure 3:
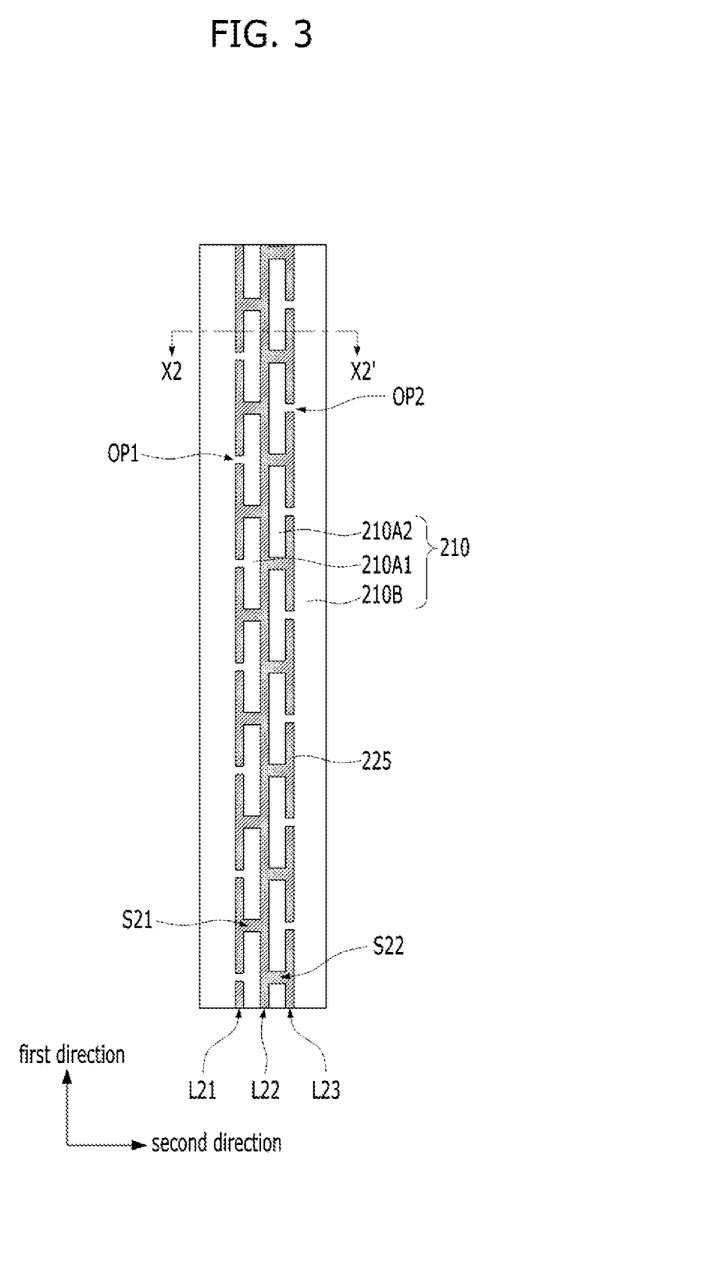
FIG. 3 is a plan view illustrating a conductive plug of a guard ring of a semiconductor device according to another embodiment of the present disclosure.

FIG. 3 is a plan view illustrating a conductive plug 225 of a guard ring of a semiconductor device according to another embodiment of the present disclosure. A cross section taken along a line X2-X2' of FIG. 3 may be substantially the same as the portion indicated by the line H1-H1' of FIG. 1. Hereinafter, differences from the above-described embodiment of FIG. 2 will be mainly described.

Referring to FIG. 3, the conductive plug 225 may include first to third long patterns L21 to L23 extending in a first direction and first and second short patterns S21 and S22 extending in a second direction crossing the first direction.

The first to third long patterns L21 to L23 may be substantially parallel to each other while spaced apart from each other in the second direction. A plurality of first short patterns S21 may be spaced apart from each other in the first direction, and may be disposed between the first long pattern L21 and the second long pattern L22 to connect the first long pattern L21 and the second long pattern L22. A plurality of second short patterns S22 may be spaced apart from each other in the first direction, and may be disposed between the second long pattern L22 and the third long pattern L23 to connect the second long pattern L22 and the third long pattern L23.

Here, the first long pattern L21 may have a shape cut between two adjacent first short patterns S21 among the plurality of first short patterns S21, thereby having a first open portion OP1 between two portions of the first long pattern L21 obtained by cutting the first long pattern L21 between the two adjacent first short patterns S21. The first open portion OP1 may be located to have substantially the same distance from the two adjacent first short patterns S21, and thus, may be formed to face the second short pattern S22 in the second direction. The first open portion OP1 may be disposed between every two adjacent first short patterns S21 in the first direction. In this case, most of a side surface of a first internal insulating layer 210A1 may be surrounded by the two portions of the first long pattern L21, the second long pattern L22, and the two adjacent first short patterns S21, and a small portion of the side surface may be open by the first open portion OP1. That is, a first portion of the side surface of the first internal insulating layer 210A1, except for a second portion of the side surface of the first internal insulating layer 210A1 corresponding to the first open portion OP1, may be enclosed by the two portions of the first long pattern L21, the second long pattern L22, and the two adjacent first short patterns S21. Thus, the first internal insulating layer 210A1 may contact and be connected to an external insulating layer 210B through the first open portion OP1.

In addition, similar to the first long pattern L21, the third long pattern L23 may have a shape cut between two adjacent second short patterns S22 among the plurality of second short patterns S22, thereby having a second open portion OP2 between two portions of the third long pattern L23 obtained by cutting the third long pattern L23 between the two adjacent second short patterns S22. The second open portion OP2 may be located to have substantially the same distance from the two adjacent second short patterns S22, and thus, may be formed to face the first short pattern S21 in the second direction. The second open portion OP2 may be disposed between every two adjacent second short patterns S22 in the first direction. In this case, most of a side surface of a second internal insulating layer 210A2 may be surrounded by the second long pattern L22, the two portions of the third long pattern L23, and the two adjacent second short patterns S22, and a small portion of the side surface may be open by the second open portion OP2. That is, a first portion of the side surface of the second internal insulating layer 210A2, except for a second portion of the side surface of the second internal insulating layer 210A2 corresponding to the second open portion OP2, may be enclosed by the second long pattern L22, the two portions of the third long pattern L23, and the two adjacent second short patterns S22. Thus, the second internal insulating layer 210A2 may contact and be connected to the external insulating layer 210B through the second open portion OP2.

In this way, when the first internal insulating layer 210A1 and the second internal insulating layer 210A2 are not isolated but connected to the external insulating layer 210B, it is possible to prevent or reduce a phenomenon in which the first and second internal insulating layers 210A1 and 210A2 are pulled out or collapsed. This is because the first and second internal insulating layers 210A1 and 210A2 are supported through connection with the external insulating layer 210B.

According to the present embodiment of FIG. 3, the advantages of the embodiment of FIG. 2 may be obtained. Furthermore, it may be possible to solve the problem of defects of the guard ring in the embodiment of FIG. 2.

Figure 4:
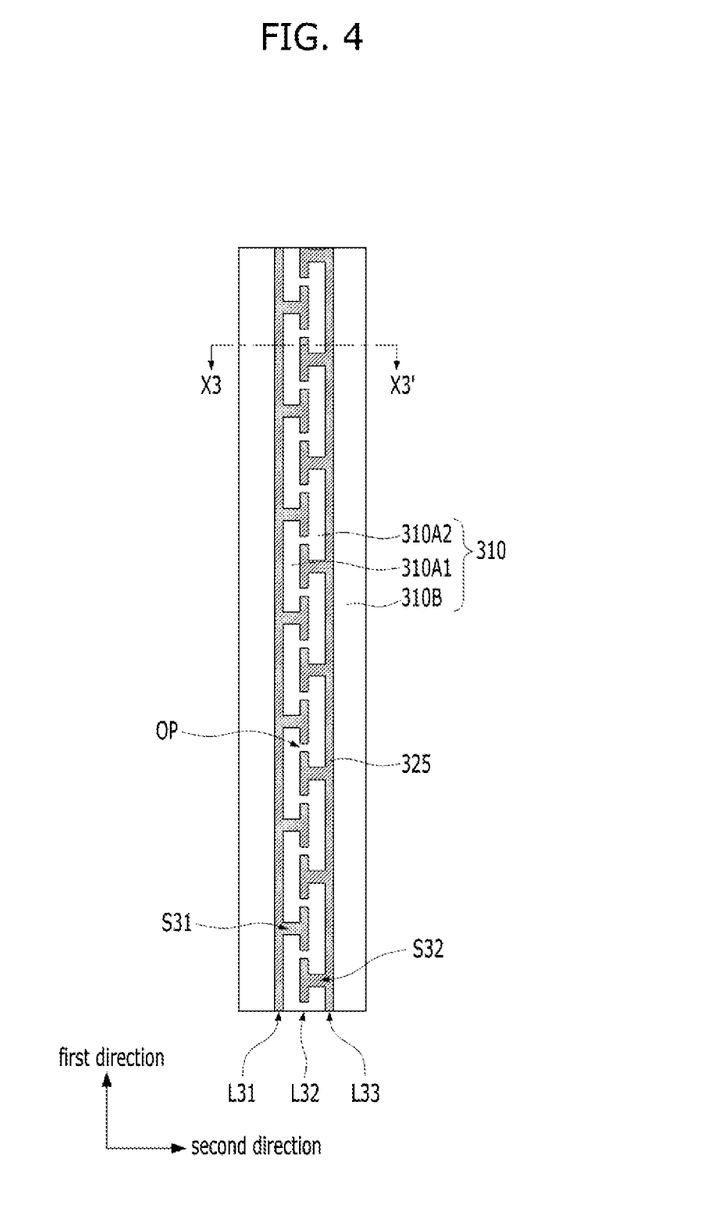
FIG. 4 is a plan view illustrating a conductive plug of a guard ring of a semiconductor device according to another embodiment of the present disclosure.

FIG. 4 is a plan view illustrating a conductive plug 325 of a guard ring of a semiconductor device according to another embodiment of the present disclosure. A cross section taken along a line X3-X3' of FIG. 4 may be substantially the same as the portion indicated by the line H1-H1' of FIG. 1. Hereinafter, differences from the above-described embodiment of FIG. 2 will be mainly described.

Referring to FIG. 4, the conductive plug 325 may include first to third long patterns L31 to L33 extending in a first direction and first and second short patterns S31 and S32 extending in a second direction crossing the first direction.

The first to third long patterns L31 to L33 may be substantially parallel to each other while spaced apart from each other in the second direction. A plurality of first short patterns S31 may be spaced apart from each other in the first direction, and may be disposed between the first long pattern L31 and the second long pattern L32 to connect the first long pattern L31 and the second long pattern L32. A plurality of second short patterns S32 may be spaced apart from each other in the first direction, and may be disposed between the second long pattern L32 and the third long pattern L33 to connect the second long pattern L32 and the third long pattern L33.

Here, the second long pattern L32 may have a shape cut between the first short pattern S31 and the second short pattern S32, which are adjacent to each other, among the plurality of first short patterns S31 and the plurality of second short patterns S32, which are alternately arranged in the first direction to be misaligned, so that the second long pattern L32 may have an open portion OP. The open portion OP may be located to have substantially the same distance from the first short pattern S31 and the second short pattern S32, which are adjacent to each other. The open portion OP may be disposed between each of the plurality of first short patterns S31 and a corresponding one of the plurality of second short patterns S32, which are adjacent to each other. In this case, a side surface of a first internal insulating layer 310A1 may be partially surrounded by the first long pattern L31, three portions of the second long pattern L32 that are separated by two open portions OP, and two adjacent first short patterns S31. That is, a first portion of the side surface of the first internal insulating layer 310A1, except for second portions of the side surface of the first internal insulating layer 310A1 corresponding to the two open portions OP, may be enclosed by the first long pattern L31, the three portions of the second long pattern L32, and the two adjacent first short patterns S31. Also, a side surface of a second internal insulating layer 310A2 may be partially surrounded by three portions of the second long pattern L32 that are separated by two open portions OP, the third long pattern L33, and two adjacent second short patterns S32. That is, a first portion of the side surface of the second internal insulating layer 310A2, except for second portions of the side surface of the second internal insulating layer 310A2 corresponding to the two open portions OP, may be enclosed by the three portions of the second long pattern L32, the third long pattern L33, and the two adjacent second short patterns S32. Thus, the first internal insulating layer 310A1 and the second internal insulating layer 310A2 may contact and be connected with each other through one open portion OP.

In this embodiment, one first internal insulating layer 310A1 may be connected to two adjacent second internal insulating layers 310A2 through two open portions OP, respectively, and one second internal insulating layer 310A2 may be connected to two adjacent first internal insulating layers 310A1 through two open portions OP, respectively.

In this way, when the first internal insulating layer 310A1 and the second internal insulating layer 310A2 are not isolated but connected to each other, a phenomenon in which the first and second internal insulating layers 310A1 and 310A2 are pulled out or collapsed may be prevented or reduced. This is because the first and second internal insulating layers 310A1 and 310A2 are supported by being connected to each other. However, in this embodiment, the first and second internal insulating layers 310A1 and 310A2 may be separated from an external insulating layer 310B.

According to the embodiment of FIG. 4, the advantages of the embodiment shown in FIG. 2 may be obtained. Furthermore, it may be possible to solve the problem of defects of the guard ring in the embodiment of FIG. 2.

Figure 5:
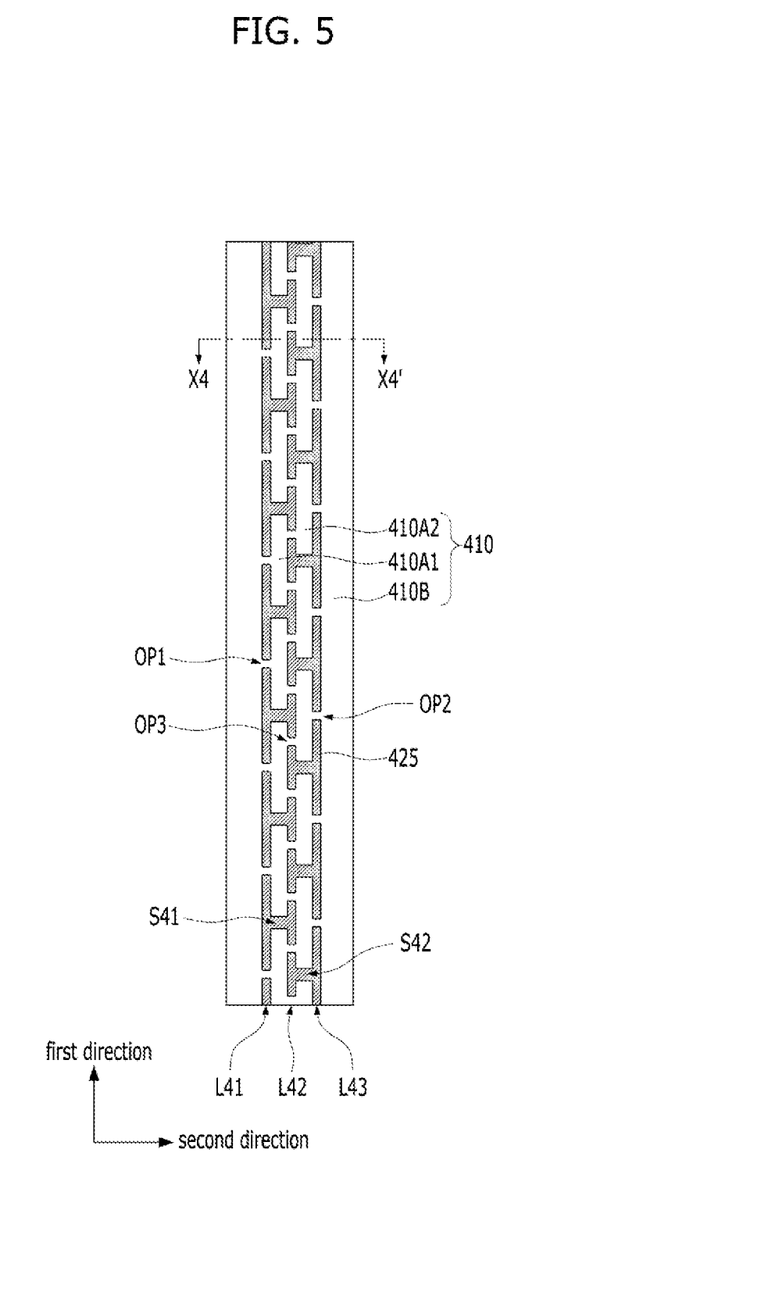
FIG. 5 is a plan view illustrating a conductive plug of a guard ring of a semiconductor device according to another embodiment of the present disclosure.

FIG. 5 is a plan view illustrating a conductive plug 425 of a guard ring of a semiconductor device according to another embodiment of the present disclosure. A cross section taken along a line X4-X4' of FIG. 5 may be substantially the same as the portion indicated by the line H1-H1' of FIG. 1. The present embodiment may be seen as a combination of the embodiment of FIG. 3 and the embodiment of FIG. 4. Hereinafter, differences from the above-described embodiment of FIG. 2 will be mainly described.

Referring to FIG. 5, the conductive plug 425 may include first to third long patterns L41 to L43 extending in a first direction and first and second short patterns S41 and S42 extending in a second direction crossing the first direction.

The first to third long patterns L41 to L43 may be substantially parallel to each other while spaced apart from each other in the second direction. A plurality of first short patterns S41 may be spaced apart from each other in the first direction, and may be disposed between the first long pattern L41 and the second long pattern L42 to connect the first long pattern L41 and the second long pattern L42. A plurality of second short patterns S42 may be spaced apart from each other in the first direction, and may be disposed between the second long pattern L42 and the third long pattern L43 to connect the second long pattern L42 and the third long pattern L43.

Here, the first long pattern L41 may have a shape cut between two adjacent first short patterns S41 among the plurality of first short patterns S41, thereby having a first open portion OP1 between two portions of the first long pattern L41 obtained by cutting the first long pattern L41 between the two adjacent first short patterns S41. The third long pattern L43 may have a shape cut between two adjacent second short patterns S42 among the plurality of second short patterns S42, thereby having a second open portion OP2 between two portions of the third long pattern L43 obtained by cutting the third long pattern L43 between the two adjacent second short patterns S42. The second long pattern L42 may have a shape cut between the first short pattern S41 and the second short pattern S42, which are adjacent to each other, among the plurality of first short patterns S41 and the plurality of second short patterns S42, which are alternately arranged in the first direction to be misaligned, so that the second long pattern L42 may have a third open portion OP3.

A first portion of a side surface of a first internal insulating layer 410A1, except for second portions of the side surface of the first internal insulating layer 410A1 corresponding respectively to one first open portion OP1 and two third open portions OP3, may be surrounded by two portions of the first long pattern L41, three portions of the second long pattern L42, and two adjacent first short patterns S41. The two portions of the first long pattern L41 may be obtained by cutting the first long pattern L41 with the one first open portion OP1. The three portions of the second long pattern L42 may be obtained by cutting the second long pattern L42 with the two third open portions OP3.

A first portion of a side surface of a second internal insulating layer 410A2, except for second portions of the side surface of the second internal insulating layer 410A2 corresponding respectively to one second open portion OP2 and two third open portions OP3, may be surrounded by three portions of the second long pattern L42, two portions of the third long pattern L43, and two adjacent second short patterns S42. The two portions of the third long pattern L43 may be obtained by cutting the third long pattern L43 with the one second open portion OP2. The three portions of the second long pattern L42 may be obtained by cutting the second long pattern L42 with the two third open portions OP3.

Thus, the first internal insulating layer 410A1 may contact and be connected to an external insulating layer 410B through the first open portion OP1, and may contact and be connected to the second internal insulating layer 410A2 through the third open portion OP3. Also, the second internal insulating layer 410A2 may contact and be connected to the external insulating layer 410B through the second open portion OP2, and may contact and be connected to the first internal insulating layer 410A1 through the third open portion OP3.

Meanwhile, as described above, the chip region may have a plate shape, and the guard ring may have a loop shape surrounding the chip region. This is exemplarily shown in FIG. 6.

Figure 6:
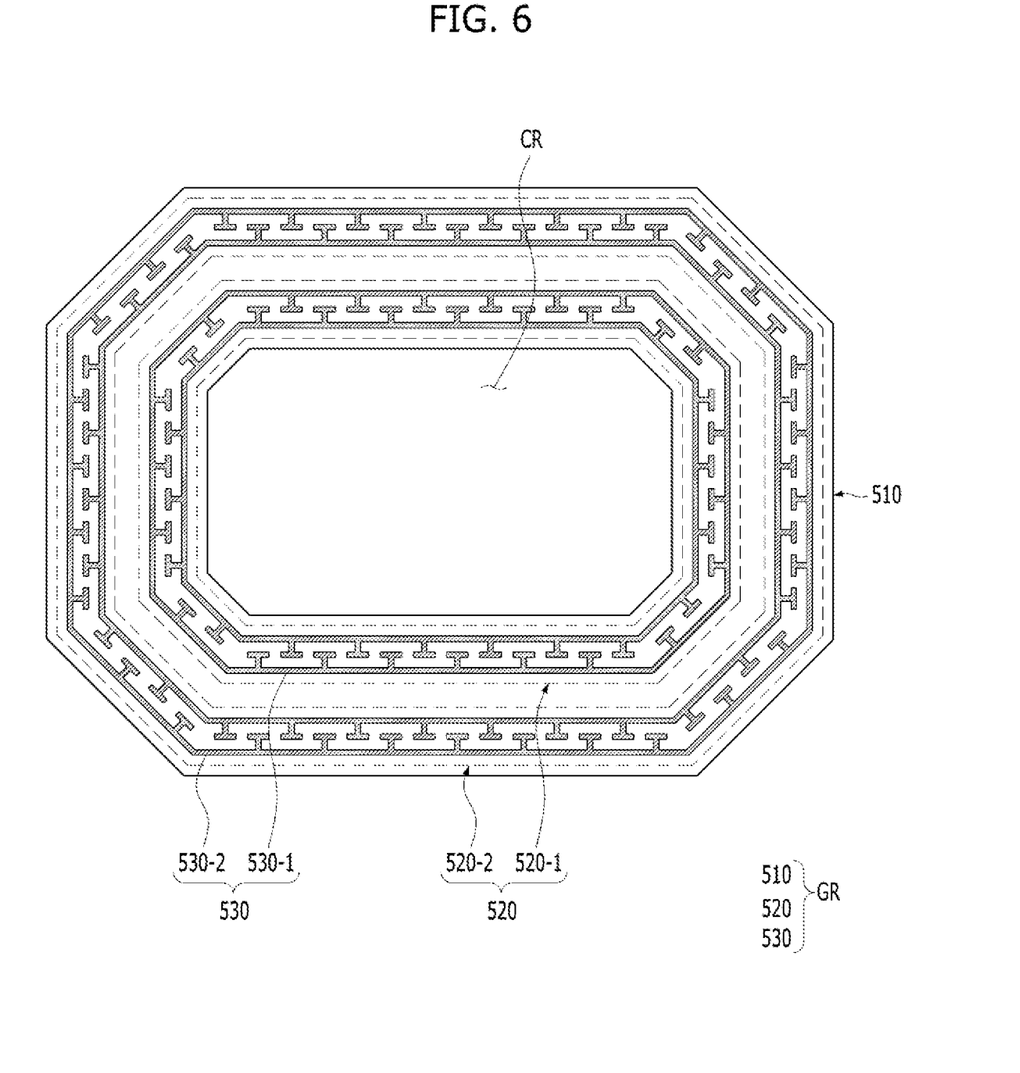
FIG. 6 is a plan view illustrating a semiconductor device according to another embodiment of the present disclosure.

FIG. 6 is a plan view illustrating a semiconductor device according to another embodiment of the present disclosure.

Referring to FIG. 6, the semiconductor device may include a chip region CR and a guard ring GR surrounding the chip region CR.

The guard ring GR may include first and second conductive patterns 510 and 520 stacked in a vertical direction perpendicular to a top surface of a semiconductor substrate, and further include a conductive plug 530 disposed between the first conductive pattern 510 and the second conductive pattern 520 to electrically connect them.

The first conductive pattern 510 may be a single conductive pattern having a relatively large width. The first conductive pattern 510 may correspond to, for example, the first conductive pattern 120A or the fifth conductive pattern 120E of FIG. 1. The first conductive pattern 510 may have a loop shape surrounding the chip region CR.

The second conductive pattern 520 may include two conductive patterns 520-1 and 520-2 having a relatively small width that is smaller than the width of the first conductive pattern 510. The second conductive pattern 520 may correspond to any one of the second to fourth conductive patterns 120B to 120D of FIG. 1. The second conductive pattern 520 may include an inner second conductive pattern 520-1 and an outer second conductive pattern 520-2. A distance from the inner second conductive pattern 520-1 to the chip region CR is shorter than a distance from the outer second conductive pattern 520-2 to the chip region CR. The inner second conductive pattern 520-1 has a loop shape surrounding the chip region CR, and the outer second conductive pattern 520-2 has a loop shape surrounding the inner second conductive pattern 520-1.

The conductive plug 530 may correspond to any one of the first to fourth conductive plugs 125A to 125D of FIG. 1, and have a shape corresponding to any one of the conductive plugs 225, 325, and 425 of FIGS. 3 to 5. The conductive plug 530 may include an inner conductive plug 530-1 overlapping the inner second conductive pattern 520-1, and an outer conductive plug 530-2 overlapping the outer second conductive pattern 520-2. In this figure, each of the inner and outer conductive plugs 530-1 and 530-2 may have a shape substantially corresponding to that of the conductive plug 425 of FIG. 4. However, embodiments are not limited thereto. Each of the inner and outer conductive plugs 530-1 and 530-2 may have a shape substantially corresponding to any one of the conductive plugs 225, 325, and 425 of FIGS. 3 to 5. In an embodiment, the inner conductive plug 530-1 may have a shape different from or identical to a shape of the outer conductive plug 530-2.

Meanwhile, in the above embodiments, a case in which a conductive plug having a shape in which two ladders are arranged side by side is formed by forming three long patterns and two sets of short patterns therebetween, has been described. However, embodiments are not limited thereto.

When two or more long patterns parallel to each other are arranged to be spaced apart from each other and a plurality of short patterns connecting them are arranged, that is, when a conductive plug having a shape in which one ladder is formed or three or more ladders are arranged side by side is formed, the above embodiments may be applied as long as an internal insulating layer surrounded by the long and short patterns is connected to an external insulating layer or to another internal insulating layer through one or more opening portions formed in the one or more long patterns among the two or more long patterns.

According to the above embodiments of the present disclosure, it may be possible to provide a semiconductor device including a guard ring capable of preventing defects while having improved characteristics.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
a semiconductor substrate; and
a guard ring including a plurality of conductive patterns stacked over the semiconductor substrate in a first direction to be spaced apart from each other, and a conductive plug disposed between two adjacent conductive patterns among the plurality of conductive patterns, the first direction being perpendicular to a top surface of the semiconductor substrate,
wherein the conductive plug includes a plurality of long patterns and a plurality of short patterns, the plurality of long patterns extending in a second direction to be parallel to each other and spaced apart from each other in a third direction, the plurality of short patterns extending in the third direction, disposed between two adjacent long patterns among the plurality of long patterns to connect the two adjacent long patterns, and spaced apart from each other in the second direction, the second direction crossing the third direction, the second and third directions being parallel to the top surface of the semiconductor substrate, and
wherein an internal insulating layer, which has a side surface that is surrounded by the two adjacent long patterns and two adjacent short patterns among the plurality of short patterns, is connected to at least one of an external insulating layer and another internal insulating layer through an open portion disposed in at least one of the two adjacent long patterns, the external insulating layer positioned outside the conductive plug.

2. The semiconductor device according to claim 1, wherein the plurality of long patterns include first to third long patterns,
the plurality of short patterns include a plurality of first short patterns connecting the first long pattern and the second long pattern, and a plurality of second short patterns connecting the second long pattern and the third long pattern,
the internal insulating layer includes a first internal insulating layer having a side surface surrounded by the first long pattern, the second long pattern, and two adjacent first short patterns among the plurality of first short patterns, and a second internal insulating layer having a side surface surrounded by the second long pattern, the third long pattern, and two adjacent second short patterns among the plurality of second short patterns, and
the open portion includes at least one of a first open portion disposed in the first long pattern, a second open portion disposed in the third long pattern, and a third open portion disposed in the second long pattern.

3. The semiconductor device according to claim 2, wherein the first internal insulating layer is connected to the external insulating layer through the first open portion, and
the second internal insulating layer is connected to the external insulating layer through the second open portion.

4. The semiconductor device according to claim 2, wherein the first internal insulating layer and the second internal insulating layer are connected to each other through the third open portion.

5. The semiconductor device according to claim 2, wherein the first internal insulating layer is connected to the external insulating layer through the first open portion,
the second internal insulating layer is connected to the external insulating layer through the second open portion, and
the first internal insulating layer and the second internal insulating layer are connected to each other through the third open portion.

6. The semiconductor device according to claim 2, wherein the first open portion is positioned between the two adjacent first short patterns among the plurality of first short patterns, and the second open portion is positioned between the two adjacent second short patterns among the plurality of second short patterns.

7. The semiconductor device according to claim 2, wherein the third open portion is positioned between one first short pattern of the plurality of first short patterns and one second short pattern of the plurality of second short patterns, the one first short pattern being adjacent to the one second short pattern.

8. The semiconductor device according to claim 2, wherein a second short pattern among the plurality of second short patterns is positioned between the two adjacent first short patterns among the plurality of first short patterns, and
a first short pattern among the plurality of first short patterns is positioned between the two adjacent second short patterns among the plurality of second short patterns.

9. The semiconductor device according to claim 1, wherein the semiconductor substrate includes a first region in which an integrated circuit is disposed, and a second region in which the guard ring is disposed.

10. The semiconductor device according to claim 9, wherein the plurality of conductive patterns and the plurality of long patterns each have a loop shape surrounding the first region.

11. The semiconductor device according to claim 9, wherein at least one of the plurality of conductive patterns includes an inner conductive pattern having a loop shape surrounding the first region, and an outer conductive pattern having a loop shape surrounding the inner conductive pattern.

12. The semiconductor device according to claim 11, wherein the conductive plug includes an inner conductive plug and an outer conductive plug, the inner conductive plug and the outer conductive plug overlapping the inner conductive pattern and the outer conductive pattern, respectively, when viewed in a plan view.

13. A semiconductor device comprising:
a semiconductor substrate; and
a guard ring including a plurality of conductive patterns stacked over the semiconductor substrate in a first direction to be spaced apart from each other, and a conductive plug disposed between two adjacent conductive patterns among the plurality of conductive patterns, the first direction being perpendicular to a top surface of the semiconductor substrate,
wherein the conductive plug includes a plurality of long patterns and a plurality of short patterns, the plurality of long patterns extending in a second direction to be parallel to each other and spaced apart from each other in a third direction, the plurality of short patterns extending in the third direction, disposed between two adjacent long patterns among the plurality of long patterns to connect the two adjacent long patterns, and spaced apart from each other in the second direction, the second direction crossing the third direction, the second and third directions being parallel to the top surface of the semiconductor substrate, and
wherein at least one of the plurality of long patterns has a shape cut between two adjacent short patterns among the plurality of short patterns.

14. The semiconductor device according to claim 13, wherein the plurality of long patterns include first to third long patterns,
the plurality of short patterns include a plurality of first short patterns connecting the first long pattern and the second long pattern, and a plurality of second short patterns connecting the second long pattern and the third long pattern, and
the conductive plug includes one or more of a first case in which the first long pattern has a shape cut between two adjacent first short patterns among the plurality of first short patterns, a second case in which the third long pattern has a shape cut between two adjacent second short patterns among the plurality of second short patterns, or a third case in which the second long pattern has a shape cut between one first short pattern of the plurality of first short patterns and one second short pattern of the plurality of second short patterns, which is adjacent to the one first short pattern.

15. The semiconductor device according to claim 14, wherein the conductive plug includes the first case and the second case.

16. The semiconductor device according to claim 14, wherein the conductive plug includes the third case.

17. The semiconductor device according to claim 14, wherein the conductive plug includes the first case, the second case, and the third case.

18. The semiconductor device according to claim 14, wherein a first internal insulating layer has a side surface surrounded by the first long pattern, the second long pattern, and the two adjacent first short patterns, and a second internal insulating layer has a side surface surrounded by the second long pattern, the third long pattern, and the two adjacent second short patterns,
the first internal insulating layer and the second internal insulating layer are connected to each other or to an external insulating layer outside the first and third long patterns.

19. The semiconductor device according to claim 13, wherein the semiconductor substrate includes a first region in which an integrated circuit is disposed, and a second region in which the guard ring is disposed.

20. The semiconductor device according to claim 19, wherein the plurality of conductive patterns and the plurality of long patterns each have a loop shape surrounding the first region.

* * * * *